United States Patent [19]

Kurata

[11] 3,961,276

[45] June 1, 1976

[54] STEREO SIGNAL DEMODULATOR IN A FOUR-CHANNEL STEREO BROADCAST RECEIVER COMPRISING MEANS FOR PERFORMING DELAY EQUALIZATION TOGETHER WITH SAMPLING OF A COMPOSITE SIGNAL

[75] Inventor: Hirotaka Kurata, Tokyo, Japan

[73] Assignee: Sansui Electric Co., Ltd., Tokyo, Japan

[22] Filed: June 23, 1975

[21] Appl. No.: 589,263

[30] Foreign Application Priority Data

June 27, 1974 Japan .............................. 49-72791

[52] U.S. Cl. ............................ 329/112; 179/1 GQ; 179/15 BT; 329/122; 329/126

[51] Int. Cl.$^{2}$ ........................................ H03D 3/18

[58] Field of Search ........... 329/112, 122, 126, 128; 179/1 GQ, 15 BT; 325/36, 349

[56] References Cited

UNITED STATES PATENTS

| | | | |
|---|---|---|---|
| 3,787,629 | 1/1974 | Limberg | 179/15 BT |
| 3,814,858 | 6/1974 | Parker | 179/15 BT |

*Primary Examiner*—Siegfried H. Grimm
*Attorney, Agent, or Firm*—Flynn & Frishauf

[57] ABSTRACT

A composite signal for a four-channel stereo broadcast includes a main channel component, first and second sub-channel components and at least one pilot signal. The composite signal is fed to a stereo signal demodulator through an FM tuner. The stereo signal demodulator derives the pilot signal out of the composite signal to produce first and second sampling pulse series, each sampling pulse having a different repetition frequency. The first sampling pulse series is fed to a delay circuit that is provided with electronic delay lines such as dynamic shift registers. The delay circuit is switched by the first sampling pulse series for sampling the composite signal, to shift sampled values. Sampled values delayed in the delay circuit are fed to a logic circuit to derive the main and first sub-channel components. The second sampling pulse series is supplied to a switching circuit for demodulating the second sub-channel component. The main and first sub-channel components are substantially equalized to the second sub-channel component in delay time.

19 Claims, 7 Drawing Figures

STEREO SIGNAL DEMODULATOR IN A FOUR-CHANNEL STEREO BROADCAST RECEIVER COMPRISING MEANS FOR PERFORMING DELAY EQUALIZATION TOGETHER WITH SAMPLING OF A COMPOSITE SIGNAL

BACKGROUND OF THE INVENTION

This invention relates to a stereo broadcast receiver and more particularly, to a receiver for use in four-channel stereo broadcasting.

Recently, there have been proposed many types of systems for quadraphonic FM broadcasting. It is usual that a frequency-modulated composite signal is transmitted from one broadcasting station in these systems. The composite signal generally includes a main channel component, first and second sub-channel components and at least one pilot signal to transmit quadraphonic signals i.e. a left front phonic signal (LF), a left back signal (LB), a right front signal (RF) and a right back signal (RB).

For example, the main channel component comprises the main channel signal (LF+LB)+(RF+RB) for reproduction of quadraphonic signals. Further, the first sub-channel component includes the first sub-channel signal (LF+LB)−(RF+RB) and the second sub-channel signal (LF−LB)+(RF−RB). Moreover, the second sub-channel component has the third sub-channel signal represented by (LF−LB)−(RF−RB).

Therefore, to reproduce quadraphonic signals, the receiver should be provided with an FM tuner for discriminating the composite signal, a demodulator for deriving each channel and a de-matrix circuit for separating the derived demodulated into quadraphonic signals.

Further, the demodulator responsive to any discriminated outputs from the FM tuner is usually equipped with three switching circuits. The composite signal through the FM tuner is, therefore, sampled at each of three switching circuits by each sampling pulse series produced from the pilot signal.

However, the FM tuner is not uniform in delay characteristic over the whole frequency band of the composite signal. Especially, the second sub-channel component is subject to large delay by the FM tuner as compared with the remaining channel components.

There has also been proposed a receiver system wherein the second sub-channel component of a single side band is derived through a band-pass filter. In this proposed receiver system, the difference in delay between the second sub-channel component and the remaining components occurs by the band-pass filter.

It is an object of this invention to provide a demodulator for use in quadraphonic FM broadcasting which enables the removal of any phase difference between each of the channel components.

It is a further object of this invention to provide a demodulator suitable for four-channel stereo use, wherein the main and the first sub-channel components are equalized so as to be equal in delay time to the second sub-channel component.

It is a still further object of this invention to provide a delay circuit which provides delay equalization and sampling of the composite signal, simultaneously.

It is a further object of this invention to provide a logic circuit in such a demodulator which is responsive to outputs of the delay circuit for deriving the main and first sub-channel components.

SUMMARY OF THE INVENTION

According to this invention, apparatus is provided for demodulating a composite signal from an FM tuner by sampling of the composite signal, the composite signal including a multi-channel signal and at least one pilot signal, said multi-channel signal including a main channel component, and first and second sub-channel components which are positioned at different frequency regions relative to each other, said second sub-channel component being subject to delay distortion different from said remaining components. The demodulator of the present invention comprises means responsive to said pilot signal for producing first and second sampling pulse series which have different repetition frequencies, delay means comprising electronic delay lines which are switched by said first sampling pulse series for shifting sampled values of said composite signal, logic means responsive to sampled values delayed at said delay means for deriving said main channel component and said first sub-channel component, and means responsive to said second sampling pulse series and said composite signal for deriving said second sub-channel component.

DETAILED DESCRIPTION OF PREFERRED EMBODIMENTS

Figure 1A:
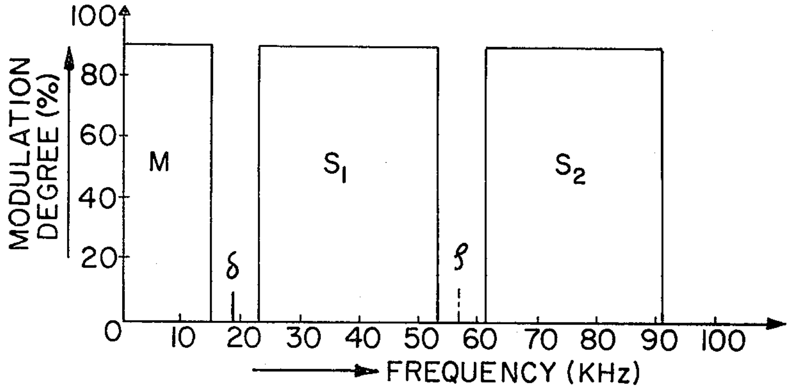
FIG. 1(a) shows a frequency spectrum of a composite signal supplied to a demodulator.

Referring to FIG. 1(a), there is shown a frequency spectrum of a composite signal supplied from an FM tuner to a demodulator according to this invention. The composite signal for four channel stereo broadcasting comprises a main channel component M, first and second sub-channel components S1 and S2, and a pilot signal $\delta$ positioned at 19 KHz. The main channel component M is representative of the one including the main channel signal (LF + LB) + (RF + RB). The first sub-channel component S1 is representative of the first sub-channel signal (LF + LB) − (RF + RB) which modulates a carrier frequency of 38 KHz, and the second sub-channel signal (LF − LB) + (RF − RB) which quadrature modulates the carrier frequency of 38 KHz. Further, the second sub-channel component S2 is representative of the third sub-channel signal (LF − LB) − (RF − RB) which modulates a carrier frequency of 76 KHz. If necessary, another pilot signal $\rho$ may be located at 57 KHz. Therefore, the composite signal F(t) including one pilot signal $\delta$ is expressed by the following equation (1);

$$F(t) = A + B \sin \omega t + C \cos \omega t + D \sin 2 \omega t + \delta \sin \frac{\omega}{2} t \quad (1)$$

where $\omega = 2 \pi f (f = 38$ KHz), A = (LF + LB) + (RF + RB), B = (LF + LB) − (RF + RB), C = (LF − LB) + (RF − RB), D = (LF − LB) − (RF − RB).

The composite signal F(t) discriminated at an FM tuner is supplied to a demodulator to be switched by some sampling pulse series. However, the composite signal F(t) discriminated at the FM tuner is usually subject to any delay which has a frequency characteristic.

Figure 1B:
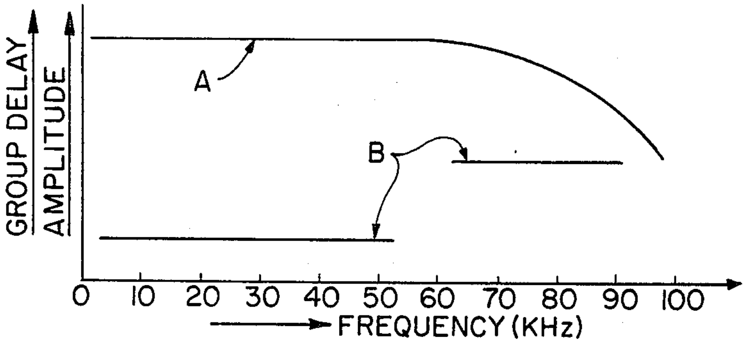
FIG. 1(b) shows amplitude and delay caracteristic of an FM tuner.

Referring to FIG. 1(b), the FM tuner has a frequency versus amplitude characteristic as shown by curve A in which a frequency region of the second sub-channel component S2 is not so high in its amplitude as other frequency regions of the main channel and first sub-channel components M and S1. Therefore, a difference of group delay time is present between the second sub-channel component S2 and other components M, S1 as shown by lines B.

There is proposed a stereo receiver system in which the second sub-channel component S2 is supplied to a band-pass filter to cut one single side band of the component S2. In this system, any delay is added to the component S2 by the band-pass filter, and as a result, unequal delay is imparted to the composite signal discriminated by the FM tuner.

Figure 2:
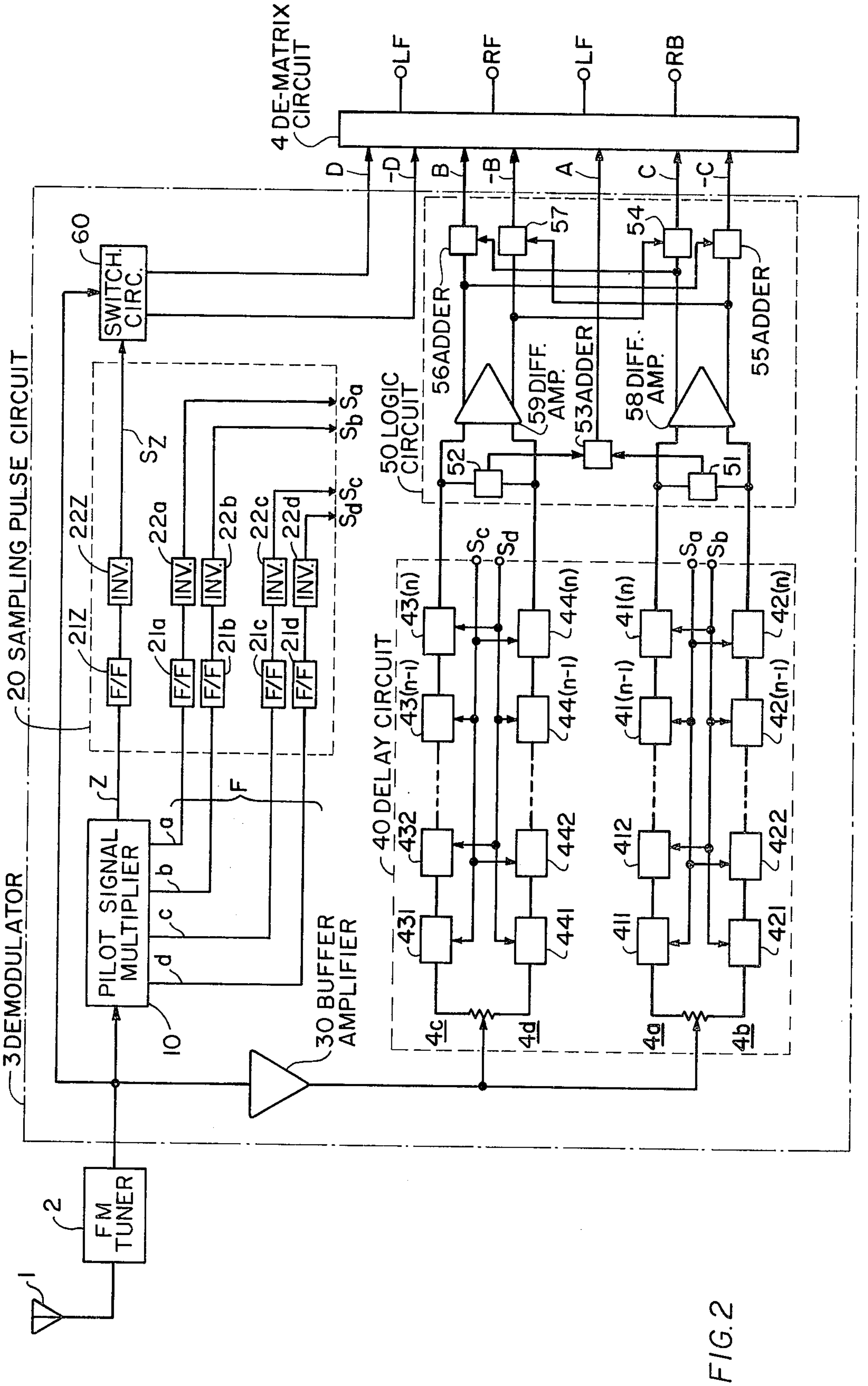
FIG. 2 shows one embodiment of a demodulator according to this invention.

Referring to FIG. 2, this embodiment is provided with an antenna 1, an FM tuner 2 for discriminating the received composite signal, a demodulator 3 receiving the signal from the FM tuner 2 and a de-matrix circuit 4 for separating quadraphonic signals LF, LB, RF and RB. The demodulator 3 includes a pilot signal multiplier 10, a sampling pulse circuit 20, a buffer amplifier 30, a delay circuit 40, and a logic circuit 50 for deriving the main channel component M and the first sub-channel component S1. Furthermore, a switching circuit 60 is included in the demodulator 3 to derive the second sub-channel component S2 which is more delayed relative to the other components M and S1.

The pilot signal multiplier 10 derives the pilot signal $\delta$ out of the composite signal to produce two pulse series, F and Z, having repetition frequencies equal respectively to carrier frequencies 38 KHz and 76 KHz of the first and second sub-channel components S1 and S2. The pulse series produced in the pilot signal multiplier 10 are supplied to the sampling pulse circuit 20 wherein the pulse series are converted into a first sampling pulse series of 38 KHz and a second sampling pulse series $S_z$ of 76 KHz. The first sampling pulse series comprises four pulse sequences, $S_a$, $S_b$, $S_c$, $S_d$, in phase quadrature.

The first sampling pulse series is sent to the delay circuit 40 responsive to the composite signal supplied through the buffer amplifier 30. The delay circuit 40 comprises four rows of electronic delay lines such as dynamic shift registers of plural steps. The composite signal fed to the delay circuit 40 is sampled at the first step of each electronic delay line at a different timing by the first sampling pulse series. Sampled values are respectively shifted to the succeeding steps at a different timing by four pulse sequences. Sampled values which are delayed by the electronic delay lines are supplied from the delay circuit 40 to the logic circuit 50.

The logic circuit 50 responsive to sampled values demodulates the main channel component M and the first sub-channel component S1. The main channel signal A of the main channel component M and the first and second sub-channel signals B and C of the first sub-channel component S1 are sent from the logic circuit 50 to the de-matrix circuit 4.

On the other hand, the second sampling pulse series of 76 KHz from the sampling pulse circuit 20 is supplied to the switching circuit 60 which also receives the composite signal. Accordingly, the second sub-channel component S2 delayed by the FM tuner 2 is demodulated in the switching circuit 60 to send the third sub-channel signal D to the de-matrix circuit 4.

The de-matrix circuit 4 responsive to the outputs of the demodulator 3 separates quadraphonic signals LF, LB, RF and RB for reproduction.

Figure 3:
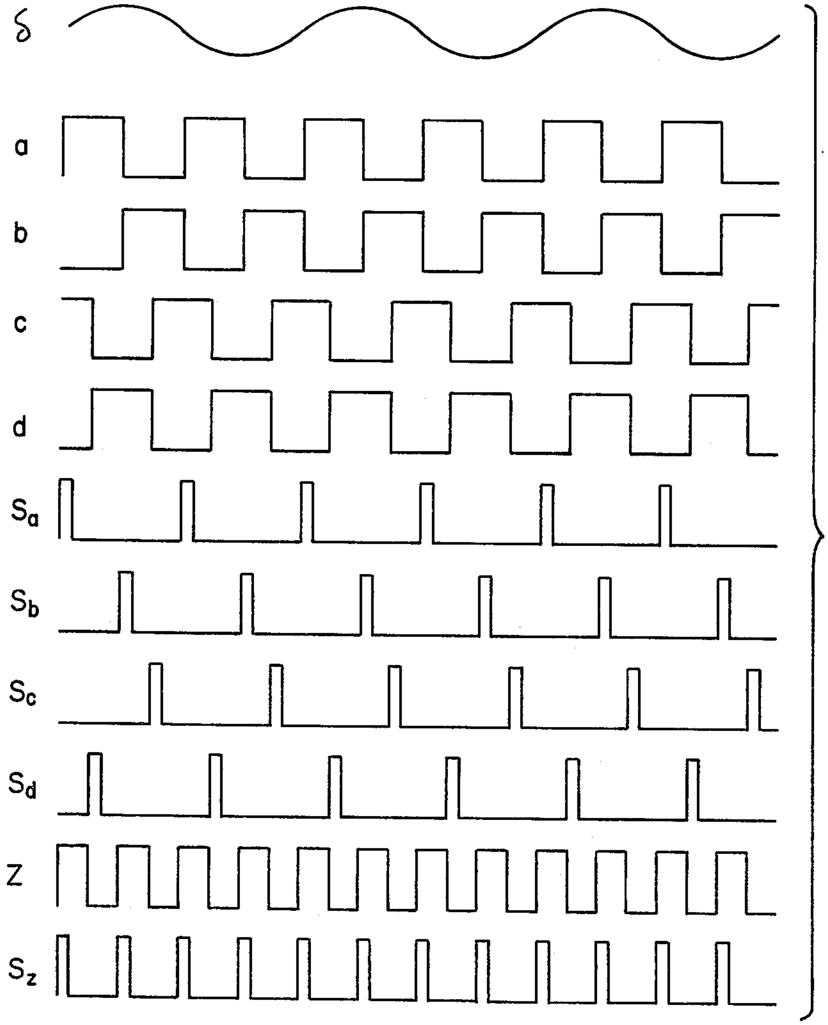
FIG. 3 shows signal waveforms in FIG. 2.
Figure 4:
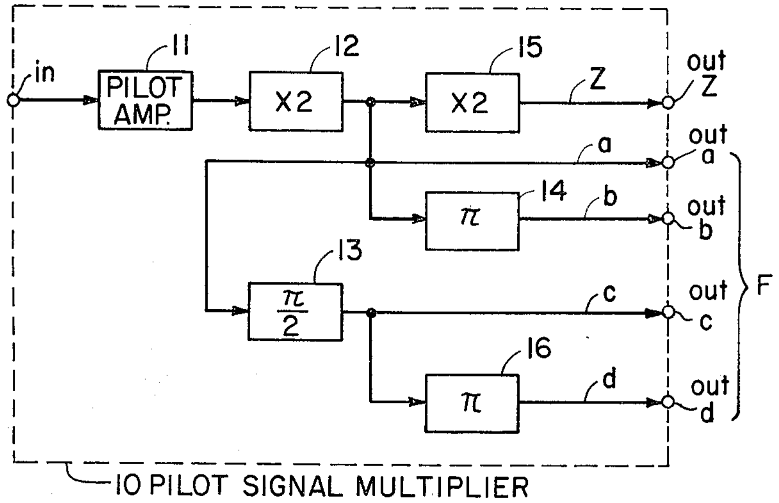
FIG. 4 shows a block diagram of a pilot signal multiplier generally shown in FIG. 2.

Referring to FIGS. 3 and 4, also, the composite signal discriminated is supplied at an input terminal (in) of the pilot signal multiplier 10 (refer to FIG. 4). The pilot signal multiplier 10 derives to amplify the pilot signal $\delta$ of 19 KHz $$\left(= \frac{\omega}{4\pi} \text{KHz}\right)$$

out of the composite signal at a pilot amplifier 11. The pilot signal $\delta$ is multiplied at a twice-multiple multiplier circuit 12 to produce a pulse sequence a of a repetition frequency equal to a carrier frequency (38 KHz) of the first sub-channel component S1. The pulse sequence a of 38 KHz is fed to an output terminal (out a), to a phase shifter 13 of $\pi/2$, to a phase inverter 14 and to a twice-multiple circuit 15. Therefore, an antiphase pulse sequence *b* relative to the pulse sequence a is fed to an output terminal (out *b*).

Further, a pulse sequence *c* which is shifted by $\pi/2$ relative to the pulse sequence a is sent from the phase shifter 13 to an output terminal (out *c*). The pulse sequence *c* is also fed to a phase inverter 16 to produce an antiphase pulse sequence *d* relative to the pulse sequence *c*, the pulse sequence *d* being fed to an output terminal (out *d* ). Therefore, a first pulse series F from the pilot signal multiplier 10 is comprised of four pulse sequences *a*, *b*, *c* and *d* of 38 KHz which are in phase quadrature to each other.

The multiplier circuit 15 responsive to the pulse sequence a feeds to an output terminal (out *z*) a pulse sequence Z multiplied to 76 KHz as a second pulse series.

Referring to FIGS. 2 and 3, the first and second pulse series F and Z from the pilot signal multiplier 10 are fed to the sampling pulse circuit 20 which includes monostable multivibrators 21*z*, 21*a*, 21*b*, 21*c*, 21*d* and inverters 22*z*, 22*a*, 22*b*, 22*c*, 22*d*. Four phase pulse sequences *a*, *b*, *c* and *d* of the first pulse series F are respectively supplied to the corresponding multivibrators 21*a* - 21*d* and inverters 22*a* - 22*d* to be converted into a first sampling pulse series of sampling pulse sequences S*a* to S*d*. Sampling pulse sequences S*a*, S*b*, S*c*, S*d*, which are in phase quadrature and which have a pulse width of $\phi$ and repetition frequency of 38 KHz, are fed from the inverters 22*a* to 22*d* of the sampling pulse circuit 20 to the delay circuit 40. On the other hand, the pulse sequence Z is fed to the multivibrator 21Z and the inverter 22Z to produce a second sampling pulse series $S_Z$ which has repetition frequency of 76 KHz.

Referring to FIG. 2, the delay circuit 40 receives the sampling pulse sequences $Sa$ to $Sd$ and comprises four rows of electronic delay lines 4a to 4d. One set of the electronic delay lines 4a and 4b receives the sampling pulse sequences $Sa$ and $Sb$ in antiphase each other. Another set of electronic delay lines 4c and 4d receives the sampling pulse sequences $Sc$ and $Sd$ in antiphase each other.

The sampling pulse sequences $Sa$ and $Sb$ are alternatively fed to one set of the delay lines 4a and 4b while the sampling pulse sequences $Sc$ and $Sd$ are alternatively supplied to another set of the delay lines 4c and 4d. Therefore, when one of two sampling pulse sequences fed to one of the delay line sets is received at one step of a delay line, the next step of the delay line receives another sampling pulse sequence.

The composite signal supplied to the delay circuit 40 through the buffer amplifier 30 is sampled at each first step of the delay lines 4a to 4d by the four sampling pulse sequences $Sa$ to $Sd$.

The sampled value which is derived at the first step 411 of the delay line 4a is represented by the following formula (2);

$$A + B \sin \phi + C \cos \phi + D \sin 2 \phi \quad (2)$$

where $\phi$ is representative of width of sampling pulse.

The sampled value from the first step 421 of the delay line 4b is similarly given by;

$$A - B \sin \phi - C \cos \phi + D \sin 2 \phi \quad (3)$$

The sampled values of the first steps 431 and 441 are respectively expressed by the following formulae (4) and (5);

$$A + B \cos \phi - C \sin \phi - D \sin 2 \phi \quad (4)$$

$$A - B \cos \phi + C \sin \phi - D \sin \phi \quad (5)$$

The sampled values represented by formulae (2) to (5) are respectively held at the first steps 411, 421, 431 and 441 until pulse sequences are supplied to the second steps 412, 422, 432 and 442 of the respective delay lines 4a to 4d. Since the pulse sequences fed to the second steps have a phase difference of $\pi$ relative to the pulse sequences of the first steps, sampled values held in the first steps are shifted to the second steps at one half of the repetition period T of the sampling pulse sequences. Therefore, when n-steps ($n \geq 2$) of delay lines are present in the delay circuit 40, the delay time $\tau$ of outputs from the delay circuit 40 is represented by the following formula (6);

$$\tau = \frac{T(n-1)}{2} = \frac{\pi(n-1)}{\omega} \quad (6)$$

Thus, the same steps of the delay lines 4a to 4d are prepared in the delay circuit 40, and accordingly, outputs having the same delay time are fed out from each of the delay lines 4a to 4d.

When K is representative of the transmission efficiency, the output of the delay line 4a is expressed by the following formula (7);

$$K \times [\text{formula } (2)] \quad (7)$$

Outputs of the delay lines 4b, 4c, and 4d are similarly represented by;

$$K \times [\text{formula } (3)] \quad (8)$$

$$K \times [\text{formula } (4)] \quad (9)$$

$$K \times [\text{formula } (5)] \quad (10)$$

It is noted that delay components by the delay circuit 40 are omitted from the foregoing formulae (7) to (10).

The four outputs from the delay circuit 40 are respectively fed to the logic circuit 50 which comprises seven adders 51 to 57 and two differential amplifiers 58, 59. Outputs from the electronic delay lines 4a and 4b are added to each other by an adder 51 to produce the sum thereof which is represented by the next formula (11);

$$[\text{formula } (7)] + [\text{formula } (8)] = 2K(A + D \sin 2\phi) \quad (11)$$

Subsequently, outputs of the electronic delay lines 4c and 4d are added by the adder 52 to obtain the sum represented by the following formula (12);

$$[\text{Formula } (9)] + [\text{formula } (10)] = 2K(A - D \sin 2\phi) \quad (12)$$

Further, sum outputs of the adders 51 and 52 are supplied to the adder 53 and the following sum shown by formula (13) is fed to the de-matrix circuit 4.

$$[\text{formula } (11)] + [\text{formula } (12)] = 4KA \quad (13)$$

As is apparent from the above formula (13), demodulated signal A of the main channel component M which is delayed by the delay circuit 40 is sent from the adder 53 to the de-matrix circuit 4.

On the other hand, outputs of the electronic delay lines 4a and 4b are fed to the differential amplifier 58 to remove in-phase components. Therefore, outputs of the differential amplifier 58 are as follows;

$$G(B \sin \phi + C \cos \phi) \quad (14)$$

$$\text{and } \{-G(B \sin \phi + C \cos \phi)\} \quad (15)$$

where G is representative of the gain of the differential amplifier.

Furthermore, outputs of the electronic delay lines 4c and 4d are fed to the differential amplifier 59. Outputs of the differential amplifier 59 are represented by the next formulae (16) and (17);

$$G(B \cos \phi - C \sin \phi) \quad (16)$$

$$\text{and } \{-G(B \cos \phi - C \sin \phi)\} \quad (17)$$

Subsequently, outputs of the differential amplifiers 58 and 59 are added by adders 54 to 57. The adder 54 responsive to a positive signal given by formula (14) and a negative signal given by formula (17) provides an output as defined by the succeeding formula (18);

$$G\{B(-\Delta\cos \phi + \sin \phi) + C(\Delta\sin \phi + \cos \phi)\} \quad (18)$$

where $\Delta$ is representative of a summation factor of one signal for another signal.

The adder 55 receives a negative signal given by formula (15) and a positive signal given by formula (16), and therefore, it provides the following output;

$$G\{B(\Delta \cos \phi - \sin \phi) - C(\cos \phi + \Delta \sin \phi)\} \quad (19)$$

The adder 56 which receives positive signals given by formula (14) and (16) provides the next output;

$$G\{B(\cos \phi + \Delta \sin \phi) - C(\sin \phi - \Delta \cos \phi)\} \quad (20)$$

The adder 57 responsive to negative signals given by formulae (15) and (17) similarly supplies the subsequent output;

$$G\{-B(\cos \phi + \Delta \sin \phi) + C(\sin \phi - \Delta \cos \phi)\} \quad (21)$$

If $\sin \phi = \Delta \cos \phi$ is satisfied at the formulae (18) to (21) by selection of the summation factor, the formulae (18) to (21) are respectively modified as follows;

$$C\ G(1 + \Delta^2)\cos \phi\ C.G(1$$

$$-C.G(1 + \Delta^2) \cos \phi \quad (23)$$

$$B.G(1 + \Delta^2) \cos \phi \quad (24)$$

$$-B.G(1 + \Delta^2) \cos \phi \quad (25)$$

Referring to formulae (22) to (25), it is clear that the second sub-channel signals C and —C of the first sub-channel component S1 are provided at the outputs of respective adders 54 and 55, while the first sub-channel signals B and —B are provided at the outputs of respective adders 56 and 57, these sub-channel signals being fed to the de-matrix circuit 4. Further, demodulated outputs derived from the logic circuit 50 are respectively delayed at the delay circuit 40.

The switching circuit 60, responsive to the composite signal, is switched by the second sampling pulse Sz to demodulate the second sub-channel component S2. Therefore, the switching circuit 60 supplies the third sub-channel signals D and − D which are subject to any delay at the FM tuner or a band-pass filter (not shown).

Delay time $\tau$ of the delay circuit 40 is given by $\pi(n-1)/\omega$ as described hereinbefore, and it is changeable by selection of the delay line steps *n*.

Accordingly, if the delay time $\tau$ of the delay circuit 40 is equal to that of the second sub-channel component S2, the delay time of the composite signal is equalized. Moreover, some passive delay lines may be added to the delay circuit 40 to equalize the delay time of the composite signal.

Outputs equalized in delay time are supplied from the demodulator 3 to the de-matrix circuit 4 to separate quadraphonic signals LF, LB, RF, and RB.

Figure 5:
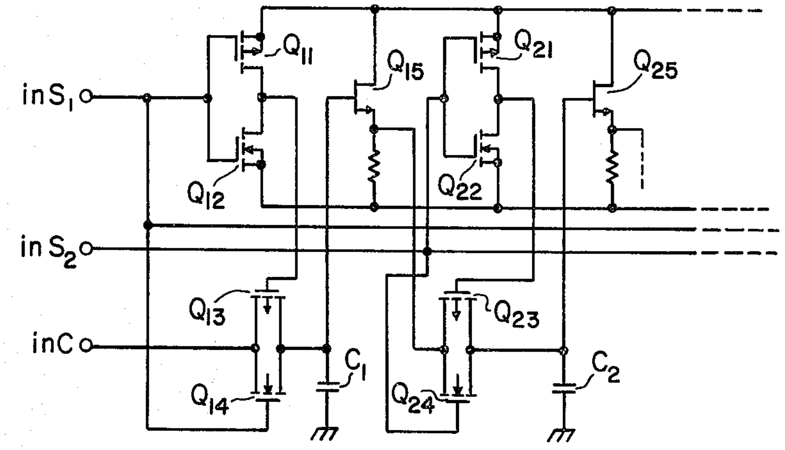
FIG. 5 shows one embodiment of a delay circuit used in FIG. 2.

Referring to FIG. 5, the electronic delay line used in the delay circuit 40 is provided with two input terminals (in S1) and (in S2) for two sampling pulse sequences and an input terminal (in C) for the composite signal. The first step of the delay line comprises transistors Q11 to Q15 and a capacitor C1, and the second step comprises transistors Q21 to Q25 and a capacitor C2. When one of the sampling pulse sequences is fed to the terminal (in S1), one of the transistors Q11 and Q12 (which are preferably compensated FET's) is conductive to send a signal, which is antiphase relative to polarity of the sampling pulse sequence, to the transistor Q13. The transistors Q13 and Q14 which respectively receive the sampling pulse and the antiphase signal are conductive to charge the capacitor C1. Therefore, the capacitor C1 is charged by the composite signal during the sampling pulse period, and its charged value is held in the capacitor C1. subsequently, when another sampling pulse series is supplied to the terminal (in S2), the charged value maintained at the capacitor C1 is shifted to a capacitor C2 through the transistor Q15 because transistors in the second step are conductive. Thus, the sampled value at the first step of the delay line is shifted to the succeeding steps in turn.

Figure 6:
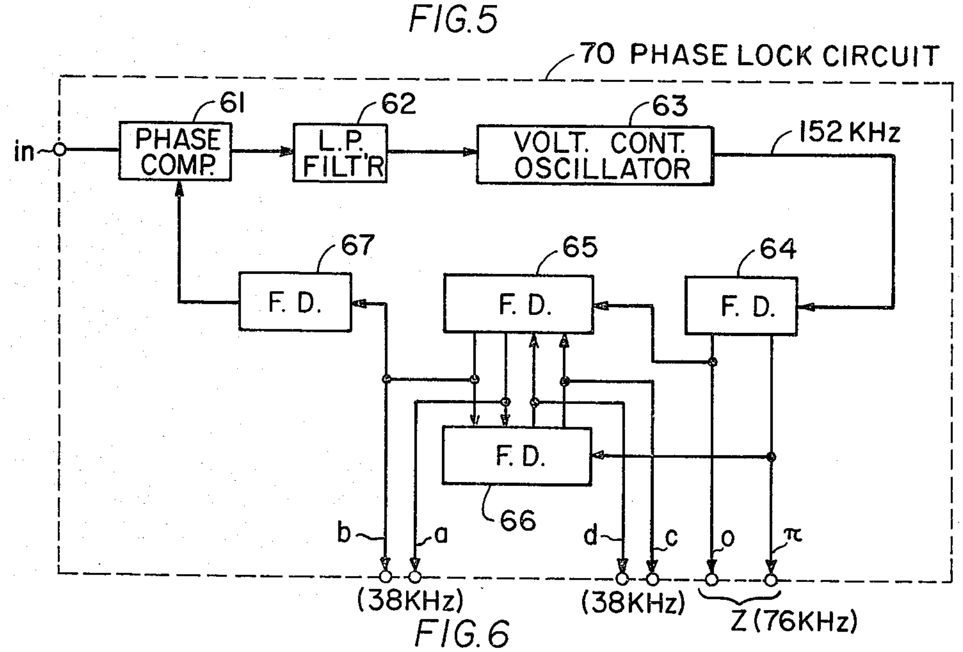
FIG. 6 shows a block diagram of a phase lock circuit which may be used in place of the pilot signal multiplier of FIG. 4.

Referring to FIG. 6, a phase lock circuit 70 which is used in lieu of the pilot signal multiplier 10 in FIG. 4 comprises a phase comparator 61, a low-pass filter 62, a voltage controlled oscillator 63 and four frequency dividers 64, 65, 66 and 67. The pilot signal $\delta$ of 19 KHz derived at the phase comparator 61 and the low-pass filter 62 is supplied to the voltage controlled oscillator 63 which generates a frequency of 152 KHz. The output of the oscillator 63 is frequency-divided at the divider 64 to obtain a frequency of 76 KHz. Two phase signals of 76 KHz are coupled from the divider 64 to the dividers 65 and 66, respectively. The divider 65 which receives a O-phase signal of 76 KHz divides this signal to provide two phase signals of 38 KHz (O-phase and $\pi$ -phase) the two phase signals being coupled to a pair of output terminals and to the divider 66. The divider 66 which receives the $\pi$ -phase signal of 76 KHz from the divider 64 and a pair of signals from the divider 65 sends a pair of phase shifted signals ($\pi/2$ - phase and $3/2\ \pi$ - phase) to a pair of output terminals and to the divider 65. An output signal from the divider 65 is supplied to the divider 67 to obtain a frequency of 19 KHz equal to the pilot frequency.

According to this demodulator, there is no delay among signals supplied to the de-matrix circuit, and reproduction with good separation is therefore accomplished by the demodulator using the phase lock circuit 70.

What is claimed is:

1. Apparatus for demodulating a composite signal from an FM tuner by sampling of said composite signal, said composite signal including a multi-channel signal and at least one pilot signal, said multi-channel signal including a main channel component, and first and second sub-channel components which are positioned at different frequency regions relative to each other, said second sub-channel component being different from said main channel component and from said first sub-channel component in delay time, comprising:

means receiving said composite signal, sampling pulse means (10, 20; 70, 20) responsive to said pilot signal for producing first ($S_a$,$S_b$,$S_c$$S_d$) and second ($S_z$) sampling pulse series which have different repetition frequencies, delay means (40) comprising plural steps of electronic delay lines responsive to said composite signal and to said first sampling pulse series ($S_a$,$S_b$,$S_c$,$S_d$), said plural steps of electronic delay lines being switched responsive to said first sampling pulse series to sample said composite signal at its first delay step and to subsequently shift the sampled values of said composite signal to the following delay step, logic means (50) coupled to said delay means (40) and responsive to sampled values delayed by said delay means for demodulating said main channel component and said first sub-channel component, and means (60) responsive to said second sampling pulse series ($S_z$) and to said composite signal for demodulating said second sub-channel component.

2. Apparatus as claimed in claim 1, wherein said second sub-channel component is located at a higher frequency region than said first sub-channel component.

3. Apparatus as claimed in claim 2, wherein said main channel component includes a main channel signal (LF + LB) + (RF + RB) for reproduction of quadraphonic signals, said first sub-channel component includes a first sub-channel signal (LF + LB) − (RF + RB) which modulates a first carrier frequency and a second sub-channel signal (LF − LB) + (RF − RB) which quadrature modulates said first carrier frequency, and said second sub-channel component includes a third sub-channel signal (LF − LB) − (RF − RB) which modulates a second carrier which has a frequency higher than said first carrier frequency.

4. Apparatus as claimed in claim 3, wherein said sampling pulse means (20) includes means for generating said first sampling pulse series which is comprised of four phase sampling pulse sequences ($S_a$, $S_b$, $S_c$, $S_d$) which are in phase quadrature, and wherein said delay means (40) comprises four rows (4*a*, 4*b*, 4*c*, 4*d*) of electronic delay lines to receive respectively said four phase sampling pulse sequences of said first sampling pulse series.

5. Apparatus as claimed in claim 4, wherein said delay means (40) comprises two sets of delays, each set of delays comprising a pair of said rows of electronic delay lines, each set delays being in response to a pair of said sampling pulse sequences which are in antiphase relative to each other.

6. Apparatus as claimed in claim 5, wherein a pair of said sampling pulse sequences is alternatively supplied to each step of at least one of said sets of delays.

7. Apparatus as claimed in claim 6, wherein said logic means (50) comprises adder means (51, 52, 53) responsive to two pairs of outputs from said delay means (40) for demodulating said main channel component.

8. Apparatus as claimed in claim 7, wherein said logic means (50) comprises means responsive to each pair of outputs from said delay means (40) for removing in-phase components from said outputs of said delay means.

9. Apparatus as claimed in claim 3, wherein said sampling pulse means comprises pilot signal multiplier means (10) responsive to said pilot signal of said composite signal for producing first and second pulse sequences which have respectively repetition frequencies equal to said first and second carrier frequencies.

10. Apparatus as claimed in claim 9, wherein said pilot signal multiplier means comprises phase shift means (13, 14, 16) responsive to said first pulse sequence for producing four pulse sequences (*a*, *b*, *c*, *d*) in phase quadrature.

11. Apparatus as claimed in claim 10, wherein said sampling pulse means comprises means including a plurality of monostable multivibrators (21*a*, 21*b*, 21*c*, 21*d*) each of which is responsive to a respective one of said four phase quadrature pulse sequences (*a*, *b*, *c*, *d*) for converting said four phase quadrature pulse sequences into four phase sampling pulse sequences ($S_a$, $S_b$, $S_c$, $S_d$), said four phase sampling pulse sequences comprising said first sampling pulse series.

12. Apparatus as claimed in claim 3, wherein said sampling pulse means comprises a phase lock circuit (70) responsive to said pilot signal of said composite signal for producing first and second pulse sequences which have respectively repetition frequencies equal to said first and second carrier frequencies.

13. Apparatus as claimed in claim 12, wherein said phase lock circuit comprises phase comparator means (61) responsive at least to said composite signal for deriving said pilot signal therefrom, a voltage controlled oscillator (63) coupled to the output of said phase comparator means for generating a signal having a frequency higher than that of said first and second carrier frequencies, and frequency divider means (64-67) responsive to the output of said voltage controlled oscillator for producing four pulse signals (*a*, *b*, *c*, *d*) in phase quadrature.

14. Apparatus according to claim 13, wherein said frequency divider means includes means (64) for producing said second pulse sequence (2) which has a frequency twice that of said four phase quadrature pulse sequences (*a*, *b*, *c*, *d*), the frequency of said four pulse sequences being the same.

15. Apparatus as claimed in claim 13, wherein said sampling pulse means comprises means including a plurality of monostable multivibrators (21*a*, 21*b*, 21*c*, 21*d*) each of which is responsive to a respective one of said four phase quadrature pulse sequences (*a*, *b*, *c*, *d*) for converting said four phase quadrature pulse sequences into four phase sampling pulse sequences ($S_a$, $S_b$, $S_c$, $S_d$), said four phase sampling pulse sequences comprising said first sampling pulse series.

16. Apparatus as claimed in claim 13 wherein said frequency dividing means includes means (67) for coupling a signal having a frequency equal to that of the pilot signal to said phase comparator.

17. Apparatus according to claim 1, further comprising de-matrix means (4) coupled to said logic means (50) and to said second sub-channel component demodulation means (60) of said demodulator for separating quadraphonic signals from the output thereof for reproduction.

18. Apparatus according to claim 1, wherein said second sub-channel component demodulation means (60) comprises a switching circuit for switching the composite signal in response to said second sampling pulse series (Sz).

19. Apparatus according to claim 1, wherein said means receiving said composite signal comprises a buffer amplifier (30) coupling said composite signal to said delay means (40).

* * * * *